United States Patent

Kiyasu et al.

[15] 3,699,567

[45] Oct. 17, 1972

[54] ANALOG CODE CONVERSION SYSTEM

[72] Inventors: Zen'iti Kiyasu, Sendai; Masao Kawashima; Shunroku Sasaki, both of Yokohama; Yukihiko Mineshima; Shyoichi Kurita, both of Kawasaki, all of Japan

[73] Assignee: Fujitsu Limited, Kawasaki, Japan

[22] Filed: Dec. 9, 1970

[21] Appl. No.: 96,600

Related U.S. Application Data

[63] Continuation-in-part of Ser. No. 644,295, June 7, 1967, abandoned.

[30] Foreign Application Priority Data

June 10, 1966 Japan ......................41/37404

[52] U.S. Cl. ..........................................340/347 AD
[51] Int. Cl. ..........................................H03k 13/02
[58] Field of Search .......340/347, 347 AD; 325/38 A

[56] References Cited

UNITED STATES PATENTS

| | | | |
|---|---|---|---|
| 2,832,827 | 4/1958 | Metzger | 340/347 X |
| 3,259,896 | 7/1966 | Pan | 340/347 |

*Primary Examiner*—Maynard R. Wilbur
*Assistant Examiner*—Charles D. Miller
*Attorney*—Curt M. Avery, Arthur E. Wilfond, Herbert L. Lerner and Daniel J. Tick

[57] ABSTRACT

A code conversion system converts analog input signals to multinary code output signals. A polarity detector and comparator determines the polarity of an input signal and compares the input signal with reference signals. The polarity detector and comparator provide a multinary code output signal in accordance with the polarity and comparison. An amplitude divider divides the input signal in amplitude in a determined manner into a determined number of divided portions of equal amplitude and positions the divided portions of the input signal adjacent each other to lengthen the time duration of the divided portions. An amplifier amplifies the output signal of the amplitude divider a number of times equal to the determined number of divided portions. A time delay prevents overlap of the signal at the output of the amplifier with the signal supplied to the input of the amplitude divider. The amplitude divider, the amplifier and the time delay are connected in series circuit arrangement in a closed loop between the input of the system and the input of the polarity detector and comparator.

5 Claims, 13 Drawing Figures

ANALOG CODE CONVERSION SYSTEM

DESCRIPTION OF THE INVENTION

The present application is a continuation-in-part of application Ser. No. 644,295, now abandoned filed June 7, 1967 for "Analog Code Conversion System," and assigned to the same assignee.

The present invention relates to an analog code conversion system. More particularly, the invention relates to a code conversion system for converting analog signals to binary, trinary, quadrinary or other multinary code. The code conversion system of the present invention may be utilized in a pulse code modulation or PCM communication system and is an extension of the feedback type coding system heretofore utilized as a binary encoder.

Known binary coding systems include the counter type, the parallel comparison type, the feedback comparison type and the propagation type. Each of the counter, parallel comparison and propagation types of coding systems has disadvantages which prevent it from attaining high speed and high precision. In order to convert analog signals in a frequency band of 5 megacycles per second in a television system to a 10 place or 10 digit binary code, the interval between the amplitude modulated pulse signals or PAM signals should be 100 nanoseconds and the precision of encoding should be about 0.1 percent of the maximum amplitude.

In the counter type binary coding system, the repetition frequency of the counting pulse becomes extremely high and reaches about 10,000 megacycles per second. This is a very difficult frequency to realize. In the parallel comparison type binary coding system, as many as about 1,000 comparator units are required for high precision. This makes the system very expensive.

A propagation type binary coding system is disclosed in my copending patent application Ser. No. 550,691, now U.S. Pat. No. 3,484,779 filed May 17, 1966. The system described in said copending patent application comprises a comparator for an $n$ place binary code, $(n-1)$ full wave rectifiers and $(n-1)$ amplifiers and operates at the same speed as the repetitive frequency of the PAM signal or sample pulse. These advantages make the propagation type binary coding system preferable to the binary coding system of other type.

A disadvantage of the known propagation type binary coding system is that the transient waveform of the signal transferred from one stage to the next becomes extremely complicated, due to the nonlinearity of the amplitude dividing circuit. This limits considerably the places of the code, the speed of operation and the precision of operation, when several stages are utilized in cascade connection, as described, for example, in the Bell System Technical Journal of November 1965, Vol. 44, No. 9, page 1913. The overlapping of transient waveforms occurring in $(n-1)$ full wave rectifiers and their corresponding amplifiers is greater in code places of lower degree and time is required for the waveform to converge to its rest condition. The error in comparison thus increases and the speed of operation decreases. Known coding systems are thus limited in speed and precision of operation.

In the feedback comparison type binary coding system, coding is achieved by comparing and detecting the polarities of signals which are maintained in circulation in the analog manner. An advantage of the feedback type system over the other types is that the feedback circuit is simple and uncomplicated.

The principal object of the present invention is to provide a new and improved analog code conversion system. The code conversion system of the present invention operates at high speed and at high precision. The code conversion system of the present invention overcomes the disadvantages of the known coding systems. The code conversion system of the present invention is inexpensive in manufacture and operation. The code conversion system of the present invention is of feedback type of simple structure. The code conversion system of the present invention provides a multinary code and utilizes reflected multinary coding so that it reduces the number of times the signals circulate through the feedback system thereby providing operation at high speed and also at high precision by reducing adverse effects of the transient waveform which occurs in an amplitude divider. The code conversion system of the present invention is inexpensive in manufacture. A binary number of 11 places, $2^{11}= 2048$, is approximately the same as a trinary number of seven places, $3^7 = 2187$. In an encoding operation at a precision of about 0.05 percent, for example, the signals circulate through the feedback system 10 times in a binary coding system, and only six times in a trinary coding system. The code conversion system of the present invention provides binary, trinary, quadrinary, quinary, or other multinary code.

In accordance with the present invention, a code conversion system for converting analog input signals to multinary code output signals comprises a source of reference signals. A polarity detector and comparator determines the polarity of a signal and compares the signal with the reference signals. The polarity detector and comparator provides a multinary code output signal in accordance with the polarity and comparison. An input is connected to the input of the polarity detector and comparator and supplies an analog input signal to the input of the polarity detector and comparator. An amplitude divider divides the input signal in amplitude in a determined manner into a determined number of divided portions of equal amplitude and positions the divided portions of the input signal adjacent each other to lengthen the time duration of the divided portions. An amplifier amplifies the output signal of the amplitude divider a number of times equal to the determined number of divided portions. A time delay is connected between the output of the amplifier and the input of the amplitude divider for preventing overlap of the signal at the output of the amplifier with the signal supplied to the input of the amplitude divider. The amplitude divider, the amplifier and the time delay are connected in series circuit arrangement in a closed loop between the input of the circuit and the input of the polarity detector and comparator.

The input of the amplitude divider is connected to a common point between the input of the circuit and the input of the polarity detector and comparator. The output of the time delay is connected to a common point between the input of the circuit and the input of the amplitude divider. The multinary code may be a trinary code, in which case the amplitude divider divides the input signal in amplitude in a determined manner into three divided portions of equal amplitude.

In accordance with the present invention, a method for converting analog input signals to multinary code output signals comprises the steps of comparing an input signal with reference signals, determining the polarity of the input signal, providing a multinary code output signal in accordance with the polarity and comparison, feeding the input signal into a closed loop, dividing the input signal in the closed loop in amplitude into a determined number of divided portions of equal amplitude, positioning the divided portions of the input signal in the closed loop adjacent each other to lengthen the time duration of the signal, amplifying the divided, positioned portions in the closed loop, delaying the divided, positioned, amplified portions in time in the closed loop, and feeding the delayed portions to the closed loop for redividing, repositioning, reamplifying and redelaying.

In order that the present invention may be readily carried into effect, it will now be described with reference to the accompanying drawings, wherein.

Figure 1:
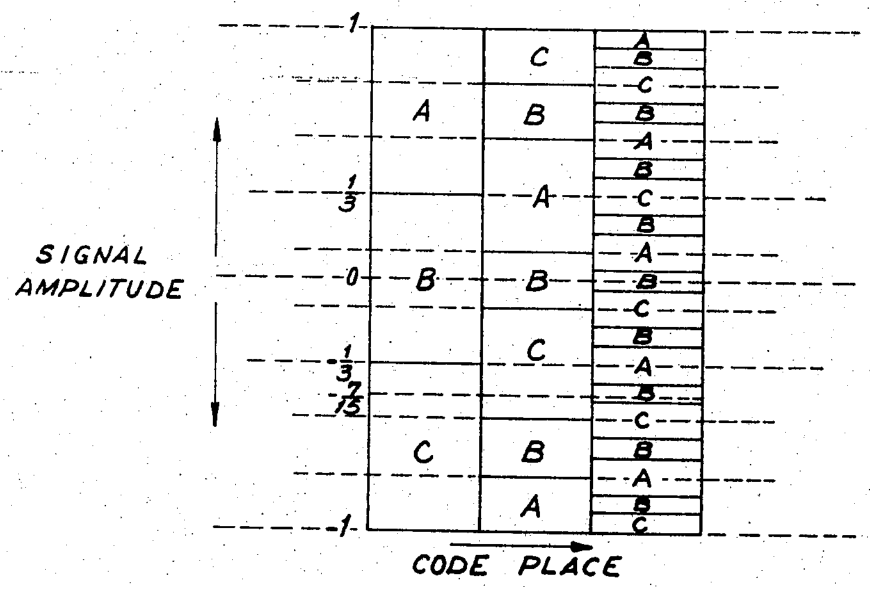
FIG. 1 is a schematic diagram illustrating the trinary code provided by an embodiment of the code conversion system of the present invention.

FIG. 1 illustrates the trinary or ternary code provided by the code conversion system of the present invention. In FIG. 1, the ordinate represents the amplitudes of the signals standardized within a range of +1 to −1 and the abscissa represents the places or digits of the trinary code. Three code places or digits are shown in FIG. 1. In FIG. 1, area A indicates a +1 signal, area B indicates a 0 signal and area C indicates a −1 signal.

As indicated in FIG. 1, the first place or first digit, on the left, of the output trinary code is a +1 signal if the standardized bipolar input signal amplitude is greater than +⅓ and is −1 if said amplitude is less than −⅓ or greater than ⅓ in the negative direction. The first place or first digit of the output trinary or ternary code is 0 if the standardized bipolar input signal amplitude is less an +⅓ or greater than −⅓ or less than ⅓ in the negative direction.

The second place or digit of the output ternary code provides three times as many variations as the first place, so that the range of variations of signals from +⅓ to +1 of the second place is the same as the variations from +1 to −1 of the first place, and this is also true for −⅓ to +⅓ of the second place and −⅓ to −1 of the second place. The amplitude range from +1/9 to +5/9 of the second place is symmetrical about the amplitude +⅓ of the first place and the amplitude range from −1/9 to −5/9 of the second place is symmetrical about the amplitude −⅓ of the first place. Thus, if the amplitude is divided at the levels +⅓ and −⅓ of the first place and the three divided portions are positioned inverted in adjacent relation to each other in the direction of the abscissa so that the duration of the signal is tripled, the +1 level and the −⅓ level will be the same and the −1 level and the +⅓ level will be the same.

The trinary code for the second place over the entire amplitude range may thus be determined by determining the code in the amplitude range of +⅓ to −⅓ by a comparison of $(⅓)^2$ and $(-⅓)^2$. Similarly, for the third place or third digit of the trinary code, in the amplitude range of +⅓ to −⅓, the amplitude is divided at the amplitude levels +1/9 and −1/9 and the code for the entire amplitude range may be determined by the comparison of $(⅓)^2$ and $(-⅓)^2$ within the amplitude range of +⅓ to −⅓. The division and positioning of the divided out parts adjacent each other to lengthen the signal duration is then successively repeated for each code place or digit and the output trinary code is thus determined from the amplitudes and polarities. Thus, the amplitude range in each case of the quadrinary code is successively divided into thirds and the three thirds are positioned adjacent each other to triple the duration of the output signal, which is then tripled in amplitude.

Figure 2:
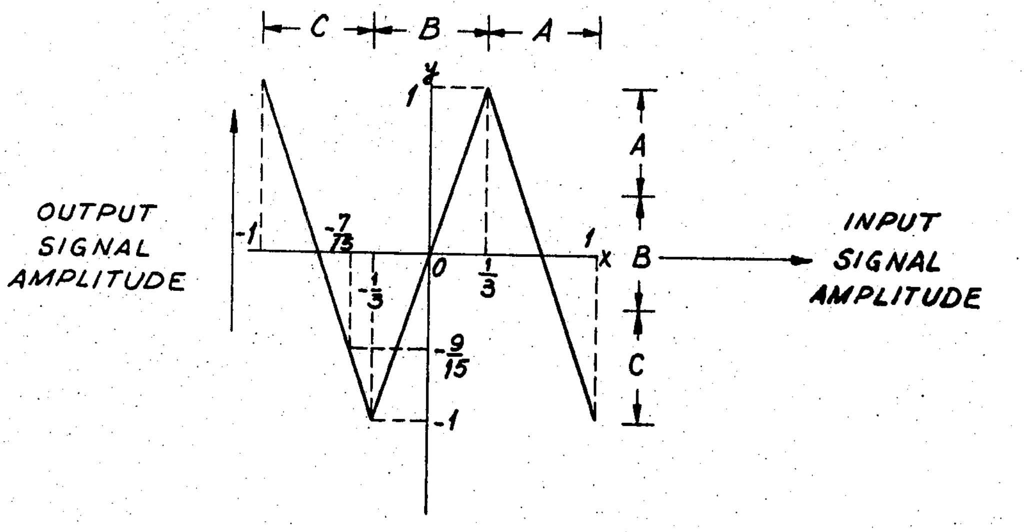
FIG. 2 is a graphical presentation illustrating the derivation of the trinary code by the code conversion system of the present invention.

The dividing or input-output characteristic of the trinary code is illustrated in FIG. 2. In FIG. 2, the abscissa represents the input signal amplitude and the ordinate represents the output signal amplitude. FIG. 2 illustrates the amplitude dividing characteristic for the second place or digit of the trinary code. The amplitude range in each case is successively divided into thirds. However, if an amplifier is provided for each place or digit of the code, so that the amplitude is tripled, a signal of the same amplitude range may be consistently utilized. The trinary or ternary code may thus be provided by a circuit which provides the input-output characteristic indicated by FIG. 2.

Figure 6A:
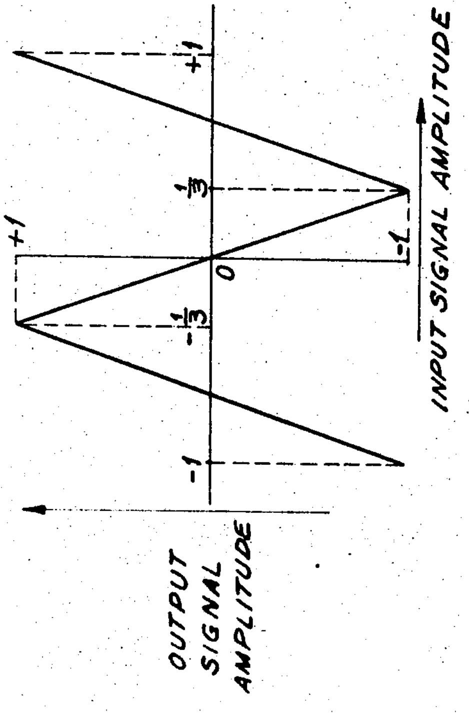
FIGS. 6A and 6B are graphical presentations of the curves of FIGS. 2 and 4 in inverse polarity.

In FIG. 2, A, B and C, extending horizontally above the curve, indicate the code signals of the first place or first digit of the trinary code and A, B and C, extending vertically to the right of the curve, indicate the code signals of the second place or second digit of said code. FIG. 6A is FIG. 2 with the signal levels +1 and −1 of the second place interchanged. The operation utilizing the characteristic of FIG. 6A is the same as that utilizing the characteristic of FIG. 2, except for the interchange in each even-numbered place or digit of the trinary code of +1 and −1.

It is thus seen, in considering FIG. 2, that the amplitude of the input-output characteristic varies in a linear sawtooth function at a slope greater than 45°. The input signal amplitude thus varies from −1 to −⅓ to produce an output signal amplitude which varies from +1 to −1; the output signal having a trinary code value of −1. The input signal amplitude then varies from −⅓ to +⅓ to produce an output signal amplitude of −1 to +1; the output signal amplitude being 0. The input signal amplitude then varies from +⅓ to +1 to produce an output signal amplitude which varies from +1 to −1; the output signal being +1. In the −1 output signal range, the characteristic has a negative slope, as it does in the +1 output signal range. In the 0 output signal range, the characteristic has a positive slope.

As indicated in FIGS. 1 and 2, an input signal having an amplitude $X$ which is equal to −7/15 may be converted to trinary code. If the amplitude $X$ is greater than or equal to −⅓ and less than +⅓, the first place of the trinary code is 0. If the input amplitude $X$ is less than −⅓, the corresponding trinary code indication is −1. If the input amplitude $X$ is greater than or equal to +⅓, the corresponding trinary code indication is +1.

The equations for the input-output characteristic curve of FIG. 2 are $Y=-3X+2$, when the output signal amplitude is $Y$ and the input signal amplitude $X$ is greater than or equal to +⅓.

$Y=3X$, when $X$ is less than + ⅓ and equal to or greater than −⅓.

$Y=3X-2$, when $X$ is less than −⅓.

As indicated in FIG. 2, an output amplitude $Y$ of −9/15 is provided by an input amplitude $X$ of −7/15. The trinary code signals are determined for each place or digit of the code by repeating the process which provides the trinary code signal for the first place.

Figure 3:
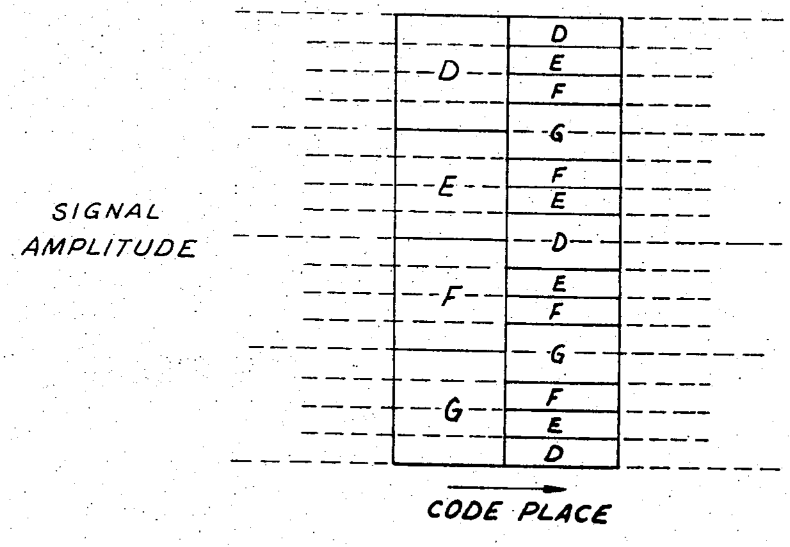
FIG. 3 is a schematic diagram illustrating the quadrinary code provided by another embodiment of the code conversion system of the present invention.
Figure 4:
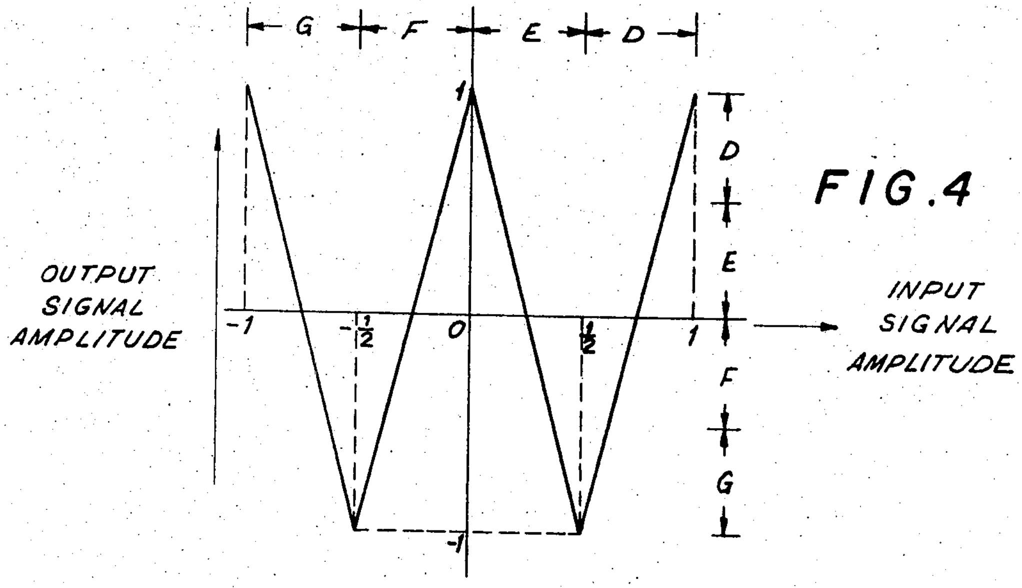
FIG. 4 is a graphical presentation illustrating the derivation of the quadrinary code by the code conversion system of the present invention.
Figure 6B:
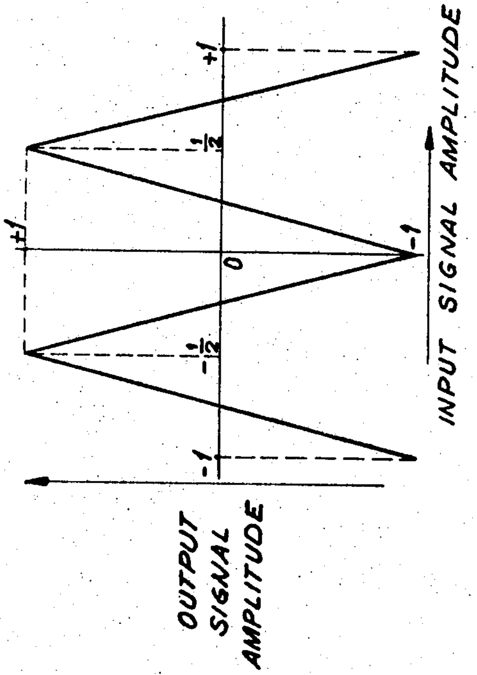

In the manner described for the provision of a trinary or ternary code by the code conversion system of the present invention, a quadrinary, quinary or any other multinary code may be provided. Thus, for example, a quadrinary code which may be provided by the code conversion system of the present invention, is illustrated in FIG. 3 and the dividing or input-output characteristics are illustrated in FIGS. 4 and 6B. Thus, a circuit which provides the dividing characteristic of FIG. 4 or the dividing characteristic of FIG. 6B may be utilized to provide the quadrinary code shown in two places or digits in FIG. 3. Such a circuit comprises an amplifier which has a gain of four.

In FIG. 3, the ordinate represents the signal amplitude and the abscissa represents the code place. Area D indicates a signal amplitude of +2, area E indicates a signal amplitude of +1, area F indicates a signal amplitude of −1 and area G indicates a signal amplitude of −2. In FIGS. 4 and 6B, the abscissa represents the input signal amplitude and the ordinate represents the output signal amplitude after division. If the input-output characteristic of FIG. 6B is utilized instead of the input-output characteristic of FIG. 4, the operation is the same for both characteristics except that +2 and −2 as well as +1 and −1 are interchanged wherever they appear when the characteristic of FIG. 6B is utilized rather than the characteristic of FIG. 4.

In FIG. 4, D, E, F and G, extending horizontally above the curve, indicate the code signals of the first place or first digit of the quadrinary code and D, E, F and G, extending vertically to the right of the curve, indicate the code signals of the second place or second digit of said code.

In FIG. 4, for example, the dividing or input-output characteristic is thus a linear sawtooth function. When the input signal amplitude is in the range of −1 to −½, it provides an output signal amplitude of +1 to −1; the quadrinary code signal is then −2. When the input signal amplitude is in the range of −½ to 0, it provides an output signal amplitude of −1 to +1; the quadrinary output signal is then −1. When the input signal amplitude varies in range from 0 to +½, it provides an output signal amplitude which varies from +1 to −1; the quadrinary output signal being +1. When the input signal amplitude varies from +½ to +1, it provides an output signal amplitude which varies from −1 to +1; the quadrinary output signal being +2. In the −2 and + 1 quadrinary code signal ranges, the characteristic has a negative slope of greater than 45°. In the −1 and +2 quadrinary code signal ranges, the characteristic has a positive slope, equal to the negative slope, of greater than 45°.

The amplitude range in each case of the quadrinary code is successively divided into fourths and the four quarters are positioned adjacent each other to quadruple the duration of the output signal, which is then quadrupled in amplitude.

The equations for the input-output characteristic of FIG. 4 are $Y=4X-5$, when $Y$ is the output signal amplitude and $X$ is the input signal amplitude and is equal to or greater than +½.

$Y=-4X+1$, when $X$ is less than +½ and equal to or greater than 0.

$Y=4X+1$, when $X$ is less than 0 and equal to or greater than −½.

$Y=-4X-5$, when $X$ is less than −½.

The code conversion system or encoder of the present invention functions to provide an output multinary code by repeating a basic operation which involves comparing the input signals with a plurality of reference signals and determining the polarity of the input signals. The input signals are also fed through a closed loop or feedback system which divides the input signal, positions its divided portions in adjacent relation to each other to increase the time duration of the signal, amplifies the divided and positioned signal and feeds the amplified signal back to the circuit for comparing and detecting the polarity as well as to the feedback circuit. A time delay circuit prevents overlap between the output signal of the feedback circuit and the input signal thereof.

Figure 5:
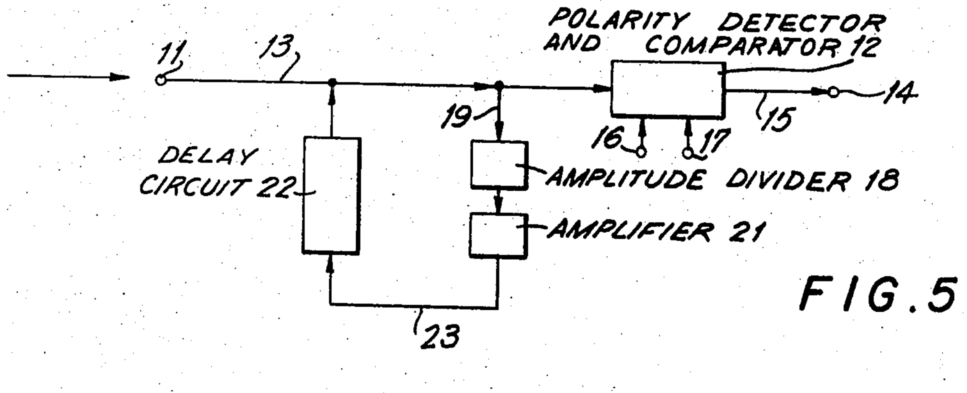
FIG. 5 is a block diagram of an embodiment of the trinary code conversion system of the present invention.

The code conversion system or encoder of the present invention for providing a trinary or ternary code having $n$ places or digits is shown in FIG. 5. In FIG. 5, an amplitude modulation pulse signal to be encoded is supplied to an input terminal 11. The signal to be encoded is supplied from the input terminal 11 to the input of a polarity detector and comparator 12 via a lead 13. The output of the polarity detector and comparator 12 is connected to an output terminal 14 via a lead 15. A plurality, which may comprise a pair, of reference signals or voltages are supplied to the polarity detector and comparator 12 via input terminals 16 and 17. The polarity detector and comparator 12 determines the polarity and amplitude of the signal to be encoded and provides a trinary output signal of +1,0 or −1.

The input signal is also supplied to the input of an amplitude divider 18 via the lead 13 and a lead 19. The output of the amplitude divider 18 is supplied to the input of an amplifier 21. The output of the amplifier 21 is connected to the input of a delay circuit 22 via a lead 23. The output of the delay circuit 22 is connected to a common point between the input terminal 11 and the input to the polarity detector and comparator 12 and the input of the amplitude divider 18. The amplifier 21 has a gain of three, just as the amplitude divider 18 divides the input signal into thirds, when the output code provided by the code conversion system of FIG. 5 is a trinary code.

During the first operation of the encoder of FIG. 5, the output signal at the output terminal 14 is the first place or first digit of the trinary code. Each successive operation of the encoder of FIG. 5 produces the next succeeding place or digit of the output trinary code until the desired $n$ places or digits are provided. When the encoder of FIG. 5 operates to produce a trinary code, the amplitude divider 18 functions to divide the input signal into three equal amplitude portions and to position the three portions adjacent each other so that the time duration of the signal provided by the amplitude divider 18 is three times the duration of the input signal fed to the input of said amplitude divider. The amplifier 21 has a gain of three. The output provided by the amplifier 21 is thus three times the input signal in duration. The time delay circuit 22 prevents the overlapping of the signal provided at the output of the amplifier 21 with the signal provided at the input of the amplitude divider 18.

If the amplitude $X$ of the input or amplitude modulated pulse signals of the code conversion system of FIG. 5, supplied to the input terminal 11 is −7/15, for example, said input signal is first compared with +⅓ and −⅓ in the polarity detector and comparator 12 and its polarity is also determined by said polarity detector and comparator. The trinary code output signal is provided by the polarity detector and comparator 12 at the output terminal 14. Since, as indicated in FIG. 1, the input amplitude $X$ of −7/15 is less than −⅓, the polarity detected by the polarity detector and comparator 12 is negative so that the trinary code output signal is −1.

The −7/15 input signal is divided into thirds in amplitude and the thirds are positioned adjacent each other in the amplitude divider 18, and the positioned portions are amplified three times by the amplifier 21 in the manner indicated by the curve of FIG. 2. The signal provided at the output of the amplifier 21 is determined in accordance with the curve of FIG. 2 so that the output signal $Y$ has an amplitude of −9/15. A signal having an amplitude of −9/15 is thus delayed by the delay circuit 22 and supplied to the lead 13 via said delay circuit. The signal $Y$ having an amplitude of −9/15 thus becomes the next succeeding input signal $X'$ and as such is supplied to the input of the polarity detector and comparator 12 and to the input of the amplitude divider 18. The result of the second operation is a trinary code output signal of −1 provided at the output terminal 14.

The dividing of the second input signal $X'$ by the amplitude divider 18 and its amplification thereafter by the amplifier 21 results in a second output signal $Y'$ equal to −3/15. The second output signal $Y'$ is then the third input signal $X''$ and, as the third input signal is supplied to the input of the polarity detector and comparator 12 and the input of the amplitude divider 18 in the third operation of the circuit. The operation of the code conversion system of FIG. 5 thus proceeds in the manner indicated. As a result of the third comparison and detection by the polarity detector and comparator 12, concerning the third input signal $X''$ having an amplitude equal to −3/15, the trinary code output signal provided at the output terminal 14 is 0. Thus, for an initial input signal $X$ having an amplitude of −7/15, the first three places or digits of the trinary code are −1, −1, 0.

If the code conversion system of FIG. 5 is utilized to provide a quadrinary code output, the amplitude divider 18 and amplifier 21 must have an input-output characteristic as shown in FIG. 4. The amplitude divider 18 must then divide the input signal into quarters of equal amplitude and the amplifier 21 must have a gain of 4. The input-output characteristics for trinary and quadrinary codes may be inverted in polarity and utilized with the same effectiveness as the curves of FIGS. 2 and 4. The input-output characteristics of inverted polarity for trinary and quadrinary codes are indicated in FIGS. 6A and 6B, respectively. If FIGS. 6A and 6B are the input-output characteristics of the feedback or closed loop portion of the polarity of the encoder of FIG. 5, the positive and negative polarities of the even numbered places of FIG. 1 are interchanged and in the third and further places of FIG. 3, D and G are interchanged and E and F are interchanged.

Figure 9:
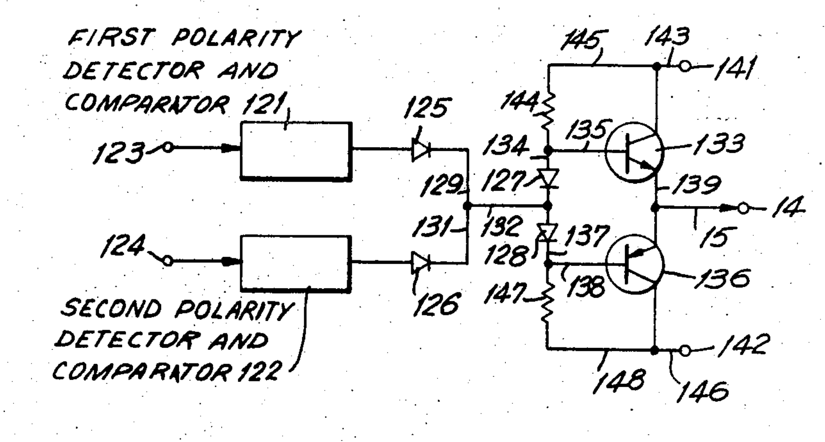
FIG. 9 is a circuit diagram of a code converter for converting the trinary code provided by the circuit arrangement of FIG. 8.

A suitable amplitude divider which may be utilized as the amplitude divider of FIG. 5 is shown in FIG. 9 of copending patent application Ser. No. 639,144 and is described in the specification thereof.

Figure 7A:
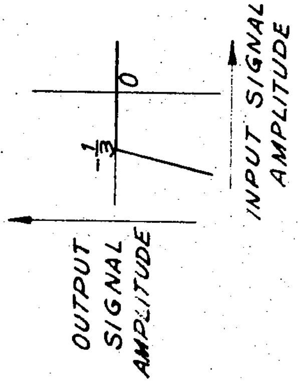
FIGS. 7A, 7B, 7C and 7D are graphical presentations illustrating the provision of the curve of FIG. 6A.

FIGS. 7A, 7B, 7C and 7D illustrate the provision of the input-output characteristic of FIG. 6A. In each of FIGS. 7A to 7D, the abscissa indicates the input signal amplitude $X$ and the ordinate indicates the output signal amplitude $Y$. In FIG. 7A, the input signal $X$ is biased by +⅓ and a negative signal is derived by the amplitude divider 18 and provides an output signal which is 4.5 times the input signal.

Figure 7B:
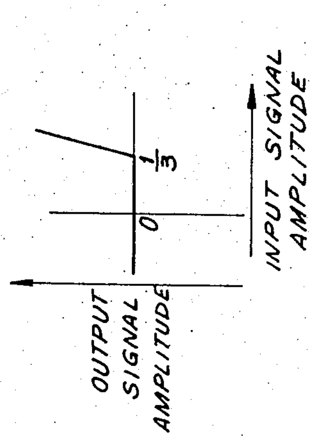
Figure 7C:
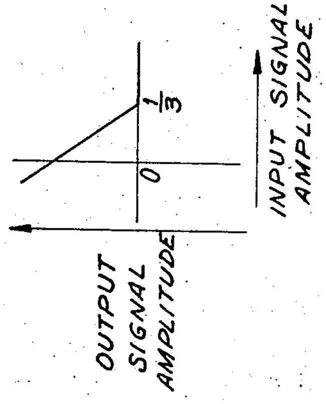
Figure 7D:
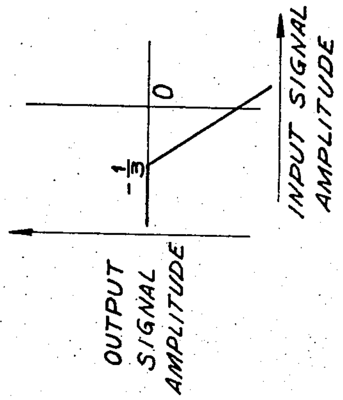

In FIG. 7B, the input signal is biased by −⅓ and a positive signal is derived by the amplitude divider 18 and is 4.5 times the input signal. In each of FIGS. 7C and 7D, the input signals are of inverted polarities. In FIG. 7C, the input signal is biased by +⅓ and a negative signal is derived by the amplitude divider 18 and is 1.5 times the input signal. In FIG. 7D, the input signal is biased by −⅓ and a positive signal is derived by the amplitude divider 18 and is 1.5 times the input signal.

The equations for the curves of FIGS. 7A, 7B, 7C and 7D are $Y_A = 4.5(X + ⅓)$, when $X$ is less than −⅓.

$Y_A = 0$, when $X$ is equal to or greater than −⅓.

$Y_B = 4.5(X - ⅓)$, when $X$ is equal to or greater than +⅓.

$Y_B = 0$, when $X$ is less than +⅓.

$Y_C = 1.5(-X + ⅓)$, when $X$ is less than +⅓.

$Y_C = 0$, when $X$ is equal to or greater than +⅓.

$Y_D = 1.5(-X - ⅓)$, when $X$ is equal to or greater than −⅓.

$Y_D = 0$, when $X$ is less than −⅓.

The output signal $Y$ is derived by adding the output signals $Y_A$, $Y_B$, $Y_C$ and $Y_D$. Thus, $Y = 4.5(X + ⅓) + 1.5(-X + ⅓) = 3X + 2$, when $X$ is less than −⅓.

$Y = 1.5(-X + ⅓) + 1.5(-X - ⅓) = -3X$, when $X$ is equal to or greater than −⅓ and is less than +⅓.

$Y = 4.5(X - ⅓) + 1.5(-X - ⅓) = 3X - 2$, when $X$ is equal to or greater than $+⅓$.

This is the input-output characteristic of FIG. 6A. The input-output characteristic of FIG. 2 is derived by inverting the polarities of the output signal $Y$ provided by the foregoing addition.

Figure 8:
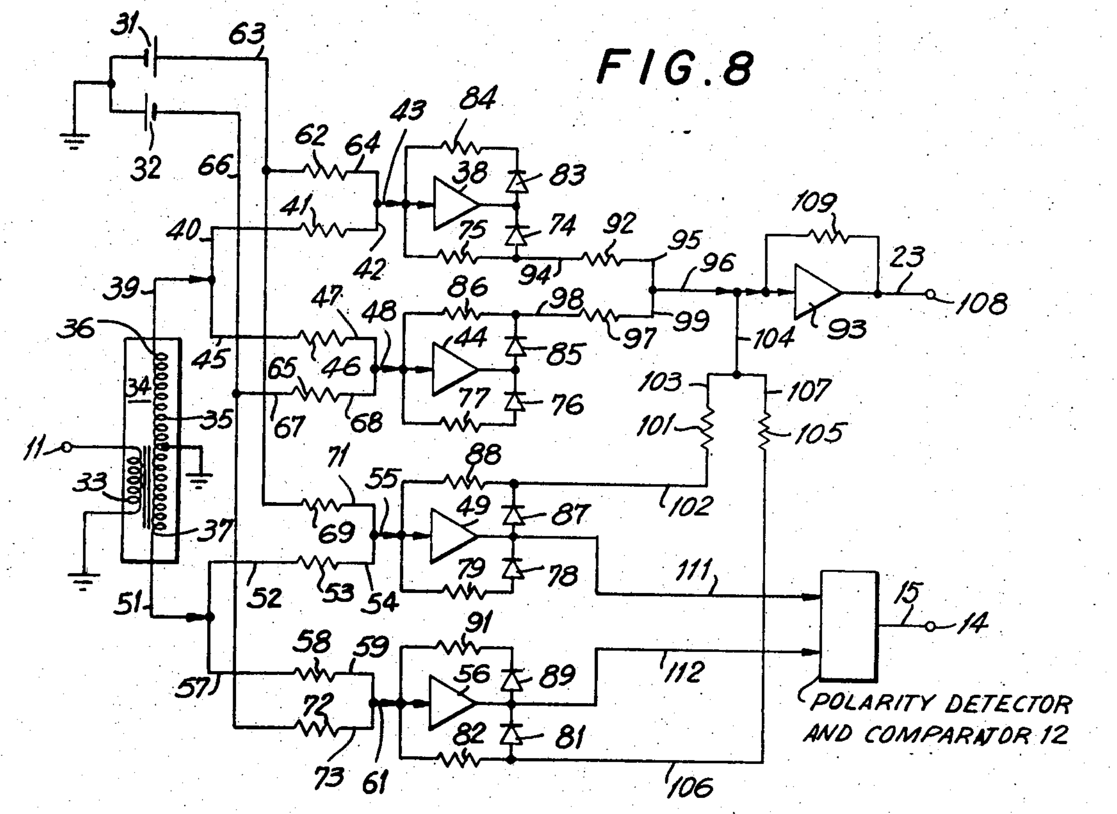
FIG. 8 is a circuit diagram of the embodiment of FIG. 5 of the trinary code conversion system of the present invention.

FIG. 8 is a circuit diagram of the trinary code conversion system of the present invention, including the amplitude divider, the amplifier and the comparator. In FIG. 8, an input signal, which is a pulse amplitude modulated or PAM signal, is applied to the input terminal 11. The circuit arrangement of FIG. 8 functions to divide the input signal and position the parts of the input signal adjacent each other so that their duration is increased after division and to amplify the signals to produce at an output terminal 14 a trinary code output signal. The circuit arrangement of FIG. 8 is a balanced circuit and functions to considerably reduce the influence of noise and to provide high precision operation at high speed with considerable facility.

In FIG. 8, a voltage source such as, for example, a battery 31, provides a bias voltage of +1 and a voltage source such as, for example, a battery 32 provides a bias voltage of −1. The input terminal 11 is connected to one end of the primary winding 33 of an input transformer 34. The other end of the primary winding 33 is connected to ground. The input transformer 34 has a secondary winding 35 which has a center tap connected to a point at ground potential. The transformer 34 converts the input signal supplied to the input terminal 11 into two signals of equal absolute amplitude, but of reverse polarities. Thus, a signal $X$ having the same amplitude and polarity as the input signal $X$ is provided at one end 36 of the secondary winding 35 of the input transformer 34 and a signal $-X$ of the same amplitude but of the opposite polarity from the input signal $X$ is provided at the other end 37 of the secondary winding 35.

The end 36 of the secondary winding 35 is connected to the input of a first amplifier 38 via input leads 39 and 40, a first input resistor 41 and leads 42 and 43. The end 36 is also connected to the input of a second amplifier 44 via the lead 39, a lead 45, a second input resistor 46, a lead 47 and a lead 48.

The other end 37 of the secondary winding 35 is connected to the input of a third amplifier 49 via a lead 51, a lead 52, a third input resistor 53, a lead 54 and a lead 55. The end 37 of the secondary winding 35 is also connected to the input of a fourth amplifier 56 via leads 51 and 57, a fourth input resistor 58 and leads 59 and 61. Each of the first to fourth input resistors 41, 46, 53 and 58 has a determined resistance value of, for example, R.

A fifth input resistor 62 is connected between the first battery 31 and the input to the first amplifier 38 via a lead 63, a lead 64 and the lead 43. A sixth input resistor 65 is connected between the second battery 32 and the input of the second amplifier 44 via leads 66, 67 and 68 and the lead 48. A seventh input resistor 69 is connected between the first battery 31 and the input of the third amplifier 49 via the lead 63, a lead 71 and the lead 55. An eighth input resistor 72 is connected between the second battery 32 via the lead 66, a lead 73 and the lead 61. The resistance value of each of the fifth to eighth summing resistors is 3R, since each of the fifth to eighth resistors 62, 65, 69 and 72 has a resistance value which is three times the determined resistance of each of the first to fourth input resistors 41, 46, 53 and 58.

The first to fourth input resistors 41, 46, 53 and 58 bias the inputs of the first to fourth amplifiers 38, 44, 49 and 56 by ± ⅓, and the fifth to eighth input resistors 62, 65, 69 and 72 bias the inputs of said amplifiers by ±⅓. Each of the amplifiers 38, 44, 49 and 56 is a high gain, phase inverting, feedback amplifier. Each of the amplifiers has positive and negative feedback paths which are determined by the polarity of the output signals from such amplifiers.

When the input signal to the first amplifier 38 is positive, the feedback path of said first amplifier is via a first diode 74 and a first feedback resistor 75. When the input signal to the second amplifier 44 is positive, the feedback path of said second amplifier is via a first diode 76 and a first feedback resistor 77. When the input signal to the third amplifier 49 is positive, the feedback path of said third amplifier is via a first diode 78 and a first feedback resistor 79. When the input signal to the fourth amplifier 56 is positive, the feedback path of said fourth amplifier is via a first diode 81 and a first feedback resistor 82.

If the input signal to the first amplifier 38 is negative, the feedback path of said first amplifier is via a second diode 83 and a second feedback resistor 84. When the input signal to the second amplifier 44 is negative, the feedback path of said amplifier is via a second diode 85 and a second feedback resistor 86. When the input signal to the third amplifier 49 is negative, the feedback path of said third amplifier is via a second diode 87 and a second feedback resistor 88. When the input signal to the fourth amplifier 56 is negative, the feedback path of said fourth amplifier is via a second diode 89 and a second feedback resistor 91.

A first output resistor 92 of the first amplifier 38 is connected between a common point in the connection between the first diode 74 and the first feedback resistor 75 thereof and the input of a summing amplifier 93 via leads 94, 95 and 96. A second output resistor 97 of the second amplifier 44 is connected between a common point in the connection between the second diode 85 and the second feedback resistor 86 thereof and the input of the summing amplifier 93 via leads 98 and 99 and the lead 96. A third output resistor for the third amplifier 49 is connected between a common point in the connection between the second diode 87 and the second feedback resistor 88 and the input of the summing amplifier 93 via leads 102, 103 and 104 and the lead 96. A fourth output resistor for the fourth amplifier 56 is connected between a common point in the connection between the first diode 81 and the first feedback resistor 82 thereof and the input of the summing amplifier 93 via leads 106 and 107 and the leads 104 and 96.

The output of the summing amplifier 93 is provided at an output terminal 108 via the lead 23, which is the same lead which provides the output of the amplifier 21 of FIG. 5 to the delay circuit 22 of FIG. 5. The summing amplifier 93 has a feedback resistor 109. The output of the third amplifier 49 is connected to a first input of a polarity detector and comparator 212 via a lead 111. The output of the fourth amplifier 56 is connected to a second input of the polarity detector and comparator 212 of FIG. 5 via a lead 112. The polarity detector and comparator 212 functions to determine the polarities of the output signals of the third and fourth amplifiers and to provide a trinary or ternary code output at the output terminal 14. Any suitable polarity detector may be utilized as the polarity detector and comparator 12 of FIG. 5 and the polarity detector and comparator 212 of FIG. 8.

The polarity detector and comparator 12 of FIG. 5 discriminates the magnitude between the input signal and the two threshold levels and produces a digital signal as a result. The polarity detector and comparator 212 of FIG. 8, however, discriminates positive or negative of the two input signals and produces a digital signal as a result.

The input current of the first amplifier 38 is equal to $(X+⅓)/R$ and the output voltage $V_1$ applied to the first output resistor 92 is 0, when the resistance value of the first feedback resistor 75 of said first amplifier is $1.5R$. The amplitude $X$ is then less than −⅓, since the first diode of the first amplifier 38 is inversely biased. When the amplitude $X$ is equal to or greater than −⅓, the output voltage $V_1$ equals $-1.5(X+⅓)$ since it is enhanced by the gain determined by the first feedback resistor 75.

Similarly, when the second feedback resistor 86 of the second amplifier 44 has a resistance value of $1.5R$, the output voltage $V_2$ of said second amplifier applied to the second output resistor 97 is equal to $-1.5(X+⅓)$, when $X$ is less than +⅓ and is 0 when $X$ is equal to or greater than +⅓.

When the resistance value of the second feedback resistor 88 of the third amplifier 49 is $4.5R$, the output voltage $V_3$ of said third amplifier, which is applied to the third output resistor 101, is $-4.5(-X+⅓)$, when $X$ is equal to or greater than +⅓ and is 0 when $X$ is equal to or less than +⅓.

When the resistance value of the first feedback resistor 82 of the fourth amplifier 56 is $4.5R$, the output voltage $V_4$ of said fourth amplifier, which is applied to the fourth output resistor 105, is $-4.5(-X-⅓)$, when $X$ is less than −⅓ and is 0 when $X$ is equal to or greater than +⅓.

The gain of the summing amplifier 93 is one and the input current to said summing amplifier is the sum of the output currents of each of the first to fourth amplifiers 38, 44, 49 and 56. The input current to the summing amplifier 93 is thus $V_1/R + V_2/R + V_3/R + V_4/R$. The sum of the currents $V_1/R$, $V_2/R$, $V_3/R$ and $V_4/R$, which equals the input current to the summing amplifier 93, is $-1.5(X+⅓)/R - 4.5(-X+⅓)/R = (3X-2)/R$, when $X$ is equal to or greater than +⅓

$-1.5(X+⅓)/R - 1.5(X-⅓)/R = -3X/R$, when $X$ is less than +⅓ and equal to or greater than −⅓

$-1.5(X-⅓)/R - 4.5(-X-⅓)/R = (3X+2)/R$, when $X$ is less than −⅓.

This is the input-output characteristic of FIG. 6A, and its polarity is inverted by the summing amplifier 93, so that the output voltage $Y$ at the output terminal 108 is $-Y$ and equals the negative of the input current to said summing amplifier multiplied by $R$. The input signal has thus been divided and amplified in accordance with the curve of FIG. 2.

If the output signal of the third amplifier 49 is indicated as 049, and is of positive polarity, $X$ may be expressed as $-(-X+⅓)$ is greater than zero, or $X$ is greater than +⅓. If the output of the fourth amplifier 56 is indicated as 056, and is of negative polarity, $X$ may be expressed as $-(-X-⅓)$ is less than zero, or $X$ is less than −⅓. The output 012 of the polarity detector and comparator 12 may thus be derived from the outputs 049 and 056 of the third and fourth amplifiers 49 and 56 by a code conversion circuit which operates to provide the relationships of 049 being negative, 056 being negative and 012 being −1, when $X$ is less than or equal to −⅓, 049 being negative, 056 being positive and 012 being 0, when $X$ is greater than −⅓ and less than or equal to +⅓, and 049 being positive, 056 being positive and 012 being +1, when $X$ is greater than +⅓. A suitable code conversion circuit for performing the desired operation is shown in FIG. 9.

FIG. 9 is a code converter for converting the trinary code provided by the polarity detector and comparator 12 of FIG. 8. The circuit of FIG. 9 may be included in the polarity detector and comparator 12 of FIG. 8. First and second polarity detectors and comparators 121 and 122, respectively, indicate the polarities of the output signals 049 and 056 of the third and fourth amplifiers 49 and 56 of FIG. 8 which are supplied to input terminals 123 and 124, respectively, of FIG. 9. If one of these signals is of positive polarity, it has a magnitude of +1. The anode of a first diode 125 is connected to the output of the first polarity detector and comparator 121 and the anode of a second diode 126 is connected to the output of the second polarity detector and comparator 122. The cathodes of the diodes 125 and 126 are connected in common to a common point between the cathode of a third diode 127 and the anode of a fourth diode 128 via leads 129, 131 and 132.

The common output of the first and second diodes 125 and 126 is applied to the base electrode of a first transistor 133 via the third diode 127. The base electrode of the transistor 133 is connected to the anode of the third diode 127 via leads 134 and 135. The common output of the first and second diodes 125 and 126 is connected to the base electrode of a second transistor 136 via the fourth diode 128. The base electrode of the second transistor 136 is connected to the cathode of the fourth diode 128 via leads 137 and 138. The first transistor 133 is an NPN type transistor and the second transistor 136 is a PNP type transistor. The emitter electrodes of the first and second transistors are connected to each other via a common connecting lead 139 to which the output terminal 14 is connected via the lead 15.

A positive voltage source is connected to a terminal 141 and a negative voltage source is connected to a terminal 142. The positive voltage at the terminal 141 is applied to the collector electrode of the first transistor 133 via a lead 143 and to the base electrode of said transistor via a resistor 144 and leads 145 and 135. The negative voltage at the terminal 142 is applied to the collector electrode of the second transistor 136 via a lead 146 and to the base electrode of said transistor via a resistor 147 and leads 148 and 138. The resistors 144 and 147 provide the desired operating points for the first and second transistors 133 and 136, respectively. The third and fourth diodes 127 and 128 function to shift the DC voltage.

The first and second diodes 125 and 126, respectively, function together as an AND circuit. The trinary code output signals provided at the output terminal 14 are those which are provided at the output terminal 14 of the polarity detector and comparator 12 of FIG. 8, since when the circuit of FIG. 9 is utilized in said polarity detector and comparator, the output terminal 14 is the same in both circuits. The resistance values of the resistors 144 and 147 are so determined that the output signal at the output terminal 14 is of positive polarity when the input signals to the first and second input terminals 123 and 124 are both positive. The output signal at the output terminal 14 is zero when a signal of positive polarity is supplied to only one of the first and second input terminals 123 and 124 and is of negative polarity when there is no signal supplied to either of said first and second input terminals.

The trinary code conversion system of FIG. 8 functions to provide the dividing, positioning, amplifying, polarity detecting and comparing operations simultaneously as a balanced circuit. The influence of noise is considerably reduced in the circuit of FIG. 8. The trinary code output is thus provided by the circuits of FIGS. 8 and 9 and a suitable time delay circuit.

A multinary encoder for providing a code output of quadrinary, quinary or higher order may utilize the same circuitry as disclosed and the speed of operation may be increased. Although a known encoder requires a high precision amplitude holding circuit, the multinary code conversion system of the present invention does not require such a holding circuit, so that it is considerably simpler in structure than known encoders.

The multinary code provided by the code conversion system of the present invention, may, of course, be converted into another code for the purpose of transmission.

While the invention has been described by means of specific examples and in a specific embodiment, we do not wish to be limited thereto, for obvious modifications will occur to those skilled in the art without departing from the spirit and scope of the invention.

We claim:

1. A code conversion system for converting analog input signals to multinary code output signals of the order $n$, where $n > 2$, said code conversion system comprising reference means for providing $n - 1$ equispaced reference signals within the range of the analog input signals providing n voltage zones;

polarity detector and comparator means for determining the polarity of a signal and comparing the analog input signals with said reference signals and for producing any of $n$ different signals in accordance with which voltage zone the input signal level lies in;

input means connected to the input of said polarity detector and comparator means for supplying an analog input signal to the input of said polarity detector and comparator means;

amplitude dividing means for converting the analog input signal to an additional analog signal having a value corresponding linearly to the proximity of the analog input signal to the nearest of said reference signals, said amplitude dividing means having an input connected to said input means and an output;

amplifying means for amplifying the additional analog signal so that the voltage range at the output of the amplitude dividing means is the same as the range of the analog input signal, said amplifying means having an input connected to the output of said amplitude dividing means and an output;

time delay means having an input connected to the output of said amplifying means and an output connected to the input of said amplitude dividing means for preventing overlap of the signal at the output of said amplifying means with the signal supplied to the input of said amplitude dividing means, said amplitude dividing means, said amplifying means and said time delay means being connected in a closed loop between said input means and the input of said polarity detector and comparator means.

2. A code conversion system as claimed in claim 1, wherein the input of said amplitude dividing means is connected to a common point between said input means and the output of said time delay means.

3. A code conversion system as claimed in claim 1, wherein said multinary code is a code of order 3.

4. A method for converting analog input signals to multinary code output signals of the order $n$, where $n > 2$, comprising the steps of comparing an input signal with reference signals;

discriminating the polarity of the input signal;

producing a multinary code output signal in accordance with the polarity and comparison;

feeding the input signal into a closed loop;

converting the analog input signal to an additional analog signal having a value corresponding linearly to the proximity of the analog input signal to the nearest of said reference signals;

amplifying the additional analog signal so that the voltage range amplified is the same as the range of the analog input signal in the closed loop;

delaying the amplified additional analog signal to prevent overlap of the additional analog signal with the analog input signal; and feeding the delayed additional analog signal to the closed loop for reconverting, reamplifying, and redelaying.

5. A method as claimed in claim 4, further comprising supplying reference signals for comparison with the input signal.

* * * * *